(12) United States Patent
Mandelman et al.

(10) Patent No.: US 6,281,064 B1
(45) Date of Patent: Aug. 28, 2001

(54) METHOD FOR PROVIDING DUAL WORK FUNCTION DOPING AND PROTECTIVE INSULATING CAP

(75) Inventors: Jack A. Mandelman; Gary B. Bronner, both of Stormville; Ramachandra Divakaruni, Middletown, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/325,941

(22) Filed: Jun. 4, 1999

(51) Int. Cl.⁷ ............................................. H01L 21/8238
(52) U.S. Cl. ................................................... 438/233
(58) Field of Search ........................ 438/233, 563, 438/291, 530, 910, 525, 231, 665, 386, 232, 556; 257/529, 331, 347, 390

(56) References Cited

U.S. PATENT DOCUMENTS 5,937,289 * 8/1999 Bronner et al. .................. 438/233
6,051,494 * 4/2000 Iwamatsu et al. ................. 438/683

* cited by examiner

*Primary Examiner*—Matthew Smith
*Assistant Examiner*—Calvin Lee
(74) *Attorney, Agent, or Firm*—Daryl K. Neff, Esq.; McGinn & Gibb, PLLC

(57) ABSTRACT

A method for providing dual work function doping and borderless array diffusion contacts includes providing a semiconductor substrate, a gate insulator, a conductor on the gate insulator, an insulating cap on the conductor and insulating spacers on sidewalls of a portion of the conductor and the insulating cap. The method also includes doping portions of the semiconductor substrate and the conductor with a first conductive type and other portions with a second conductive type. The conductor may be annealed such that dopants of the first and second conductive types spread over the respective conductors.

35 Claims, 6 Drawing Sheets

METHOD FOR PROVIDING DUAL WORK FUNCTION DOPING AND PROTECTIVE INSULATING CAP

This application is related to the following U.S. patent applications filed on even date herewith: "MODIFIED GATE CONDUCTOR PROCESSING FOR POLY LENGTH CONTROL IN HIGH DENSITY DRAMs", Ser. No. 08/914,474 and "METHOD AND APPARATUS FOR PROVIDING LOW-GIDL DUAL WORKFUNCTION GATE DOPING WITH BORDERLESS DIFFUSION CONTACT", Ser. No. 09/325,943), the Specifications of which are incorporated herein by reference.

BACKGROUND OF THE INVENTION

1. Field of the Invention

The present invention generally relates to a method for providing dual work function doping, and more particularly relates to providing an array of gate structures whereby some of the gate structures are P+ doped and other gate structures are N+ doped. The present invention is especially advantageous for providing structures that include both DRAMs and logic circuits.

2. Description of the Related Art

Over the last several years, significant advances have occurred in increasing the circuit density in integrated circuit chip technology. The ability to provide significantly increased numbers of devices and circuits on an integrated circuit chip has, in turn, created an increased desire to incorporate or integrate additional system functions onto a single integrated circuit chip. In particular, an increasing need exists for joining both memory circuits and logic circuits together on the same integrated circuit chip.

In fabricating dynamic random access memory (DRAM) circuits, the emphasis has been on circuit density along with reduced cost. On the other hand, when fabricating logic circuits, the emphasis has been on creating circuits that operate faster. Accordingly, this desire for dual work function creates additional problems with respect to the complexity and relative cost of the fabricating process. For instance, memory circuits achieve increased density requirements by employing self-aligned contacts (borderless bit line contacts), which are easily implemented in a process having a single type (e.g. typically N+ type) gate work function. A buried-channel P-type metal oxide semiconductor (PMOSFET) is used in creating DRAMs since such permits a single work function gate conductor, N+, to be used throughout the fabrication process. This results in significant cost savings in fabricating DRAMs, but at the expense of creating an inferior performing PMOSFET. On the other hand, logic circuits require both P+ and N+ gated MOSFETs in order to achieve the necessary switching speeds. P+ and N+ gate conductor devices are highly desirable for merged logic and DRAM products.

High-performance logic requires the use of both N+ and P+ doped gate conductors. Although currently practiced high-performance logic processes provide dual workfunction gate conductors, they do not use an insulating gate cap because of density requirements, and hence the need for diffusion contacts borderless to gate conductors, which are of secondary importance to speed. In 13 DRAMs, an insulating cap which is self-aligned to the gate conductor is essential for forming bitline contacts which are borderless to the wordlines. Borderless contacts are needed for achieving the highest density memory cell layouts. However, cost-effective DRAM processes use only a single N+ polysilicon gate conductor. Thus, there is currently no economically attractive process for providing both dual workfunction gate doping and the capability of borderless diffusion contacts.

SUMMARY OF THE INVENTION

In view of the foregoing and other problems of the conventional techniques, an object of the present invention is to provide dual workfunction doping gate conductors and including a self-aligned insulating gate cap.

It is another object of the present invention to provide dual work function doping. This may include providing a semiconductor substrate, a gate insulator conductor (comprising intrinsic polysilicon and overlying silicide layer) and an insulating cap. The method may also include providing insulating spacers (such as boron silicate glass spacers) along sides of the silicide layer ($WSi_x$) and the insulating cap, doping portions of the semiconductor substrate and the conductor with a first conductive type and other portions with a second conductive type, and annealing the conductor such that the dopants of the first and second conductive types spread over the respective conductors.

Portions of the silicide layer and portions of the insulating cap may be etched to form a partial gate conductor stack prior to providing the insulating spacers. After providing the insulating spacers and prior to doping, the method may further include etching the intrinsic conductor at areas of the conductor not covered by the spacer material.

An oxide layer may be formed on portions of the semiconductor substrate not covered with the intrinsic conductor. Insulating spacers may be removed prior to doping portions of the semiconductor substrate and the conductor.

Portions of the semiconductor substrate may correspond to source and drain contact regions. The method may further include extending the source and drain regions in the support region of the substrate to a region at least under the annealed conductor. The method may also include forming source and drain regions in the array regions.

It is also an object of the present invention to achieve the dual work function requirement for selectively applying either P+ or N+ doping to the gate conductor while at the same time creating a self-aligned insulating cap on the gate conductor.

Other objects, advantages and salient features of the invention will become apparent from the following detailed description taken in conjunction with the annexed drawings, which disclose preferred embodiments of the invention.

BRIEF DESCRIPTION OF THE DRAWINGS

The invention will be described in detail with reference to the following drawings in which like reference numerals refer to like elements and wherein.

DETAILED DESCRIPTION OF PREFERRED EMBODIMENTS OF THE INVENTION

Figure 1:
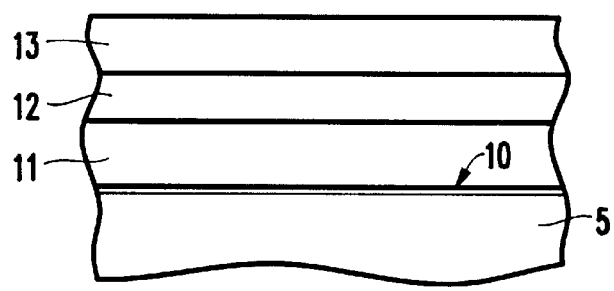
FIG. 1 shows an initial semiconductor structure.
Figure 2:
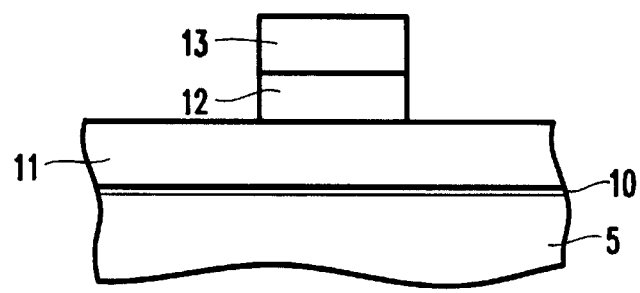
FIG. 2 shows the FIG. 1 semiconductor structure after etching.

FIGS. 1 and 2 will now be described with respect to forming a partial gate conductor stack. Following that discussion, the figures will be divided to show the gate conductor stack in support regions and array regions of the semiconductor structure.

FIG. 1 shows a semiconductor substrate 5 which is initially provided and a gate oxide layer 10 provided over the substrate 5. The semiconductor substrate 5 is typically silicon but can be any semiconductor material such as group II-VI semiconductors, group III-V semiconductors, or a composite silicon semiconductor such as silicon carbide. The semiconductor substrate 5 typically contains well doping regions which have been implanted prior to the formation of the overlying layers. Further, a nitride or oxy nitride gate insulator may be used rather than the gate oxide layer 10.

A gate stack is deposited over the substrate 5 and the gate oxide layer 10. The gate stack may include an intrinsic (i.e., undoped) polysilicon layer 11, a tungsten silicide ($WSi_x$) layer 12, and a silicon nitride layer 13 acting as a nitride cap 13.

A gate conductor (GC) mask, such as a layer of resist material (not shown) of the type employed in known lithographic masking and etching techniques, is placed over the nitride cap 13. Any well-known photosensitive polymerizable resist materials may be used. The resist material may be applied by spinning or by spraying, for example. The gate stack is patterned and etched through the nitride cap 13 and the $WSi_x$ layer 12 down to the polysilicon layer 11 as shown in FIG. 2. Overetching into the polysilicon layer 11 is acceptable.

As is known in the art, the semiconductor structure may include array regions and support regions and the following discussion regarding FIGS. 3A–9B contains different processes between the support region and the array region. Since the layout in the array region requires the utmost density, minimum channel length (minimum polysilicon gate conductor stack width) and minimum space between gate conductors is utilized. In the array region, a minimum space between gate conductors requires that diffusion contacts be borderless to the array gate conductors (wordlines). Borderless contact technology is most compatible and least expensive for single workfunction gate conductors (i.e., preferably N+).

Since density requirements in the support regions are more relaxed than in the array, borderless diffusion contacts and gate conductors with insulating caps are not required. However, dual workfunction gate conductors in the supports are desired for improved performance. In the following discussion each of FIGS. 3A, 4A, 5A, 6A, 7A, 8A, and 9A shows the structure in the array region and each of FIGS. 3B, 4B, 5B, 6B, 7B, 8B and 9B shows the structure in the support region.

Figure 3A:
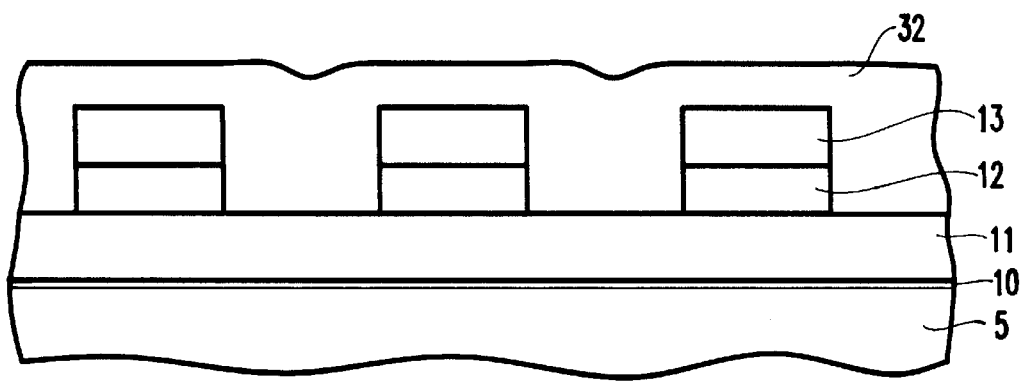
FIGS. 3A and 3B show the semiconductor structure in the array and support regions, respectively, after depositing spacer material.
Figure 3B:
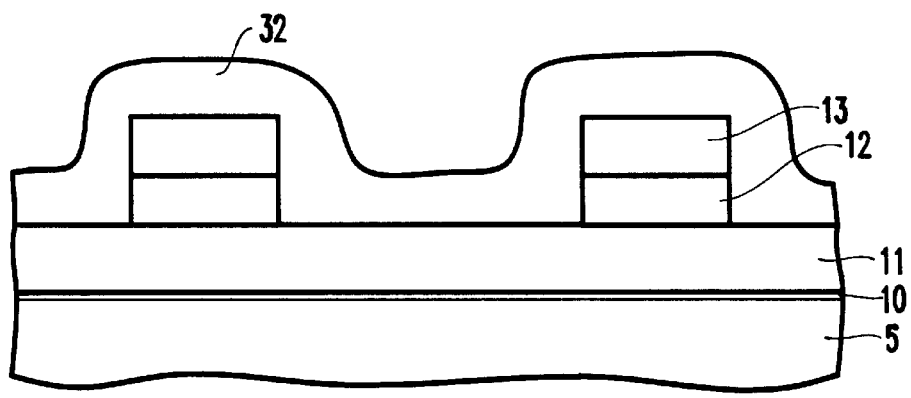

As shown in FIG. 3, a layer of boron silicate glass (BSG) 32 is conformally deposited over the partially patterned gate stack. The BSG 32 thickness is selected such that the narrow spaces between gate conductors (wordlines) in the array region (FIG. 3A) are completely filled while the wider spaces in the support region (FIG. 3B) contain the topography of the conformal layer of the BSG 32 (FIG. 3B). In an exemplary case, for a 150 nm minimum feature size, the spacing between gate conductors in the array region (FIG. 3A) is nominally approximately 150 nm, whereas the spacing between gate conductors in the support region (FIG. 3B) is typically 300 nm or greater. A BSG layer 32 thickness of between approximately 80 nm and 140 nm is preferably used.

Figure 4A:
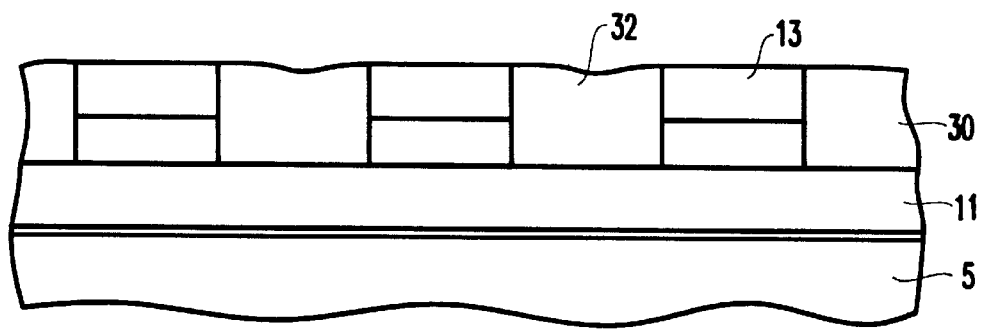
FIGS. 4A and 4B show the semiconductor structure after etching spacer material.
Figure 4B:
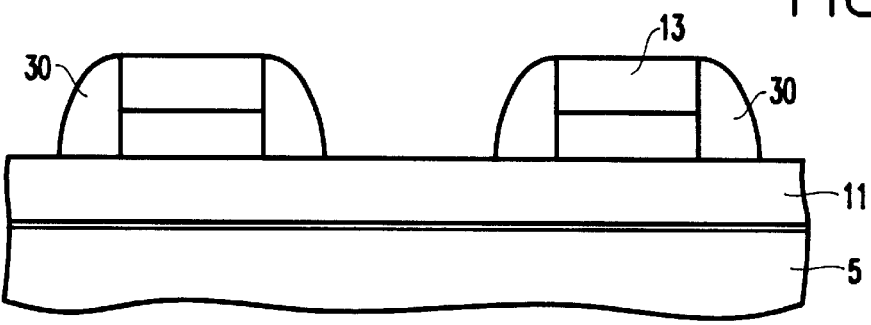

The deposited BSG 32 is then reactive ion etched (RIE'd) selectively to the silicon nitride, forming spacers 30 on the gate sidewalls in the support region (FIG. 4B), but leaving the spaces filled in with the BSG 32 in the array region (FIG. 4A).

Figure 5A:
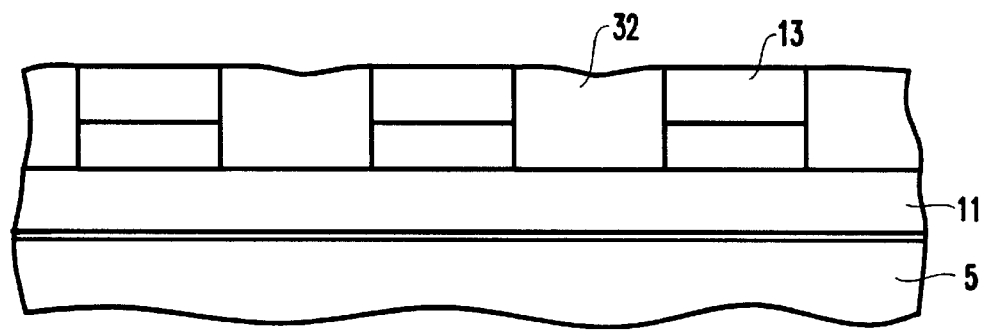
FIGS. 5A and 5B show the semiconductor structure after formation of a screen oxide layer.
Figure 5B:
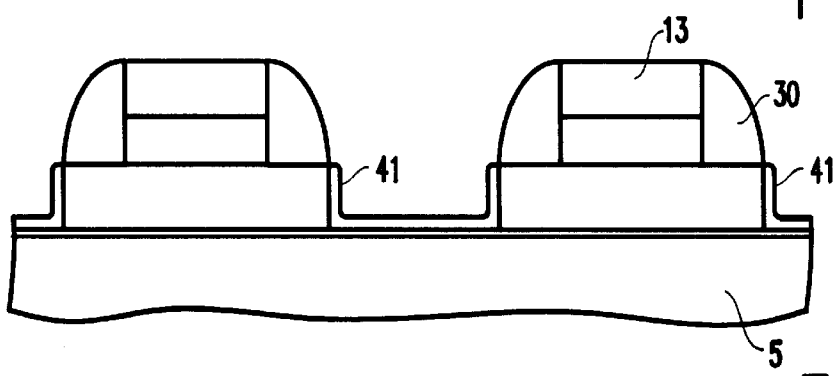
Figure 6A:
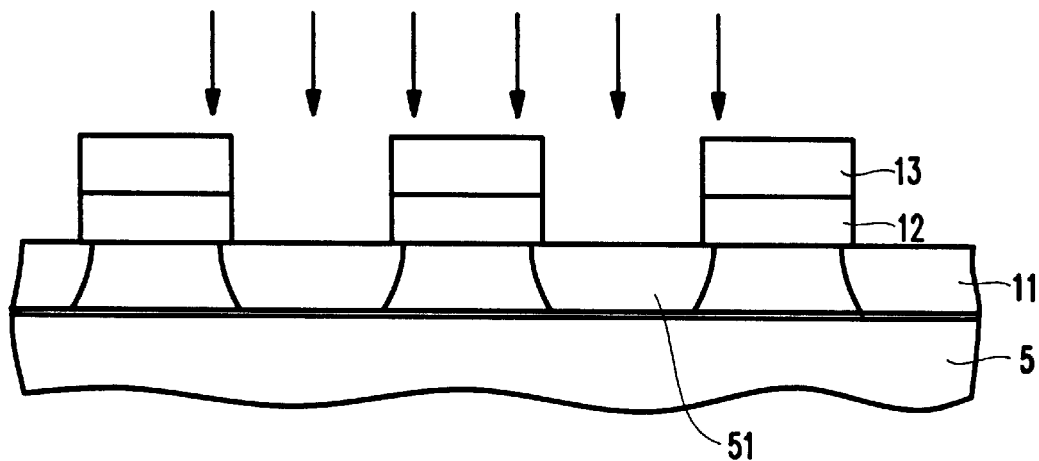
FIGS. 6A and 6B show the semiconductor structure after doping.
Figure 6B:
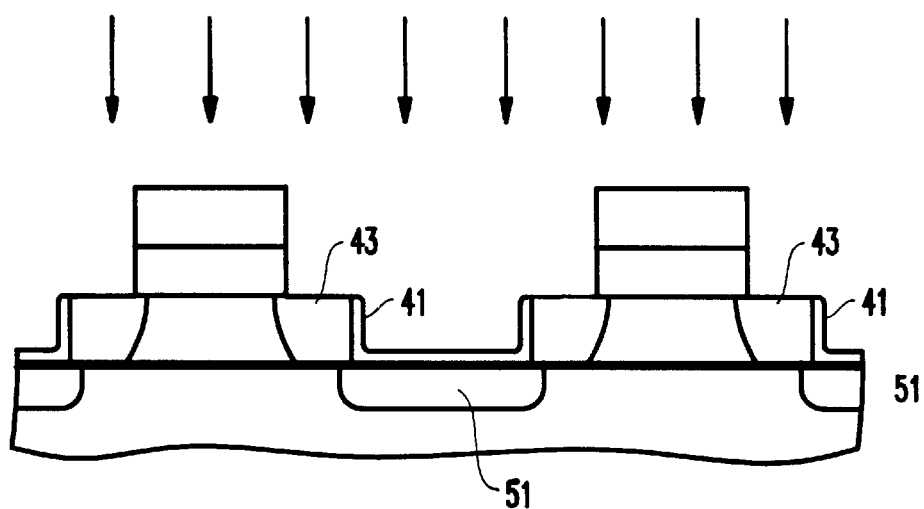

In the support region, the exposed intrinsic polysilicon layer 11 of the gate stack is reactive ion etched selectively to oxide and nitride, stopping on the gate oxide layer 10 over the substrate 5. Because of the spacers 30 in the support region (FIG. 5B) and the protective BSG 32 (i.e., blocking layer) filling the gaps between gate conductors in the array region (FIG. 5A), only the support region gate polysilicon layer 11 is opened by the RIE process. A screen oxide layer 41 is preferably thermally grown on the exposed silicon substrate 5 as shown in FIG. 5B. The screen oxide layer 41 protects the surface of the substrate 5 from ion implant damage due to subsequent implantation of source-drain dopant. Furthermore, screen oxidation also "heals" the silicon surface from any plasma damage induced during the gate polysilicon reactive ion etch.

The BSG 32 is then isotropically etched selective to SiN silicon, $WSi_x$ and thermal oxide using etchants well known in the art (i.e., wet HF/sulphuric acid). Since BSG etches much more rapidly than the thermally grown oxide layer 41, the screen oxide layer 41 is left mostly intact. Masked ion implants are then used to introduce N+ dopant (e.g., As or Phos) into the gate polysilicon layer 11 of the array region (FIG. 6A), into the gate polysilicon layer 11 of the support region's (FIG. 6B) NFETs (i.e., in the exposed ledges 43), and into a portion of the source-drain regions 51 of the support region's NFETs. The support region's PFETs receive a P-type dopant implant (typically boron) into the gate polysilicon layer and the source-drain regions 51. The energy of the N+ implant is selected such that the amount of dopant penetrating through the array region's gate polysilicon layer 11 into the substrate 5 is negligible.

Figure 7A:
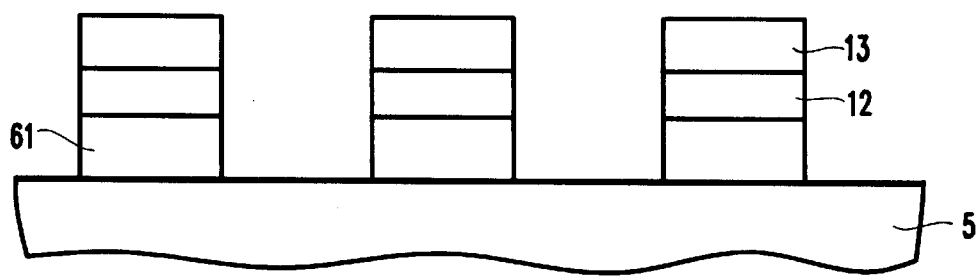
FIGS. 7A and 7B show the semiconductor structure after annealing.
Figure 7B:
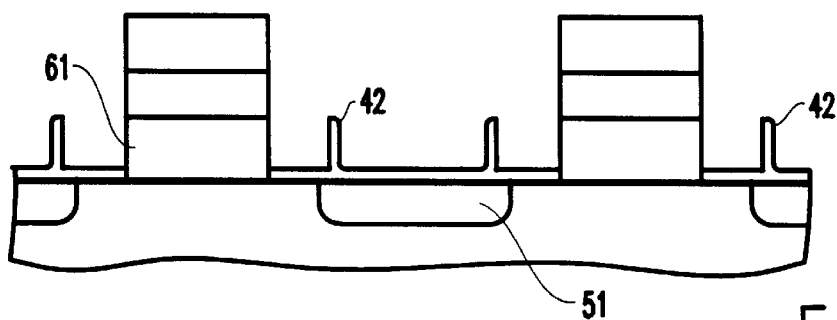

Then, as shown in FIGS. 7A and 7B, a high temperature anneal is used to distribute the dopants throughout the lateral extent of the gate polysilicon layer 11. This anneal may have a broad range of time and temperature; for example 1100° C. for 10s to 850° C. for 30 minutes. Since the diffusivity of dopant in polysilicon is typically 100× greater than in single crystal silicon, the junctions which were implanted into the silicon substrate 5 diffuse by an insignificant amount during the anneal. A silicon reactive ion etch is then used to remove the gate polysilicon ledges 43 in the support region (FIG. 7B) and to separate the gate polysilicon conductors in the array region (FIG. 7A).

Figure 8A:
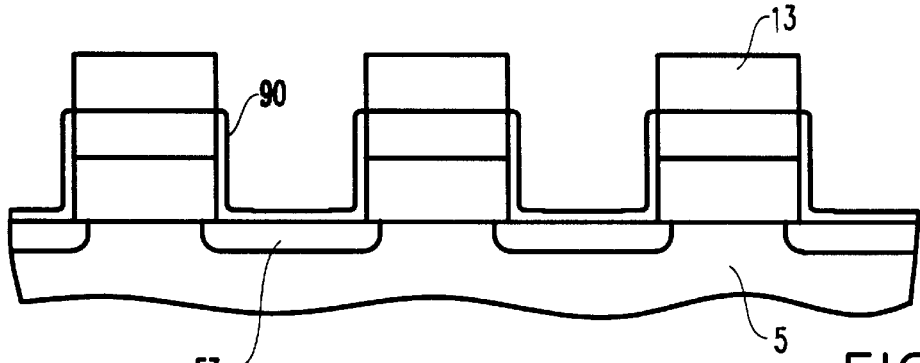
FIGS. 8A and 8B show the semiconductor structure after source-drain extension.
Figure 8B:
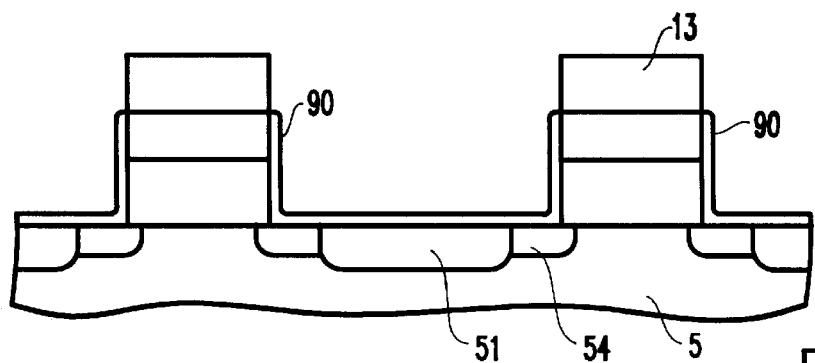

Then, the oxide ears 42 are removed by a dilute HF etch and a gate sidewall oxide 90 is grown (FIG. 8B). Array diffusions (N-type) 53 and support source-drain extensions (N and P-type) 54 are implanted depending on the type of FET as shown in FIG. 8B. Typical extension implants for NFETs preferably may be done using Phos at $5 \times 10^{13}$–$5 \times 10^{14}$ $cm^{-2}$ at 5–20 keV or As at $5 \times 10^{13}$–$5 \times 10^{14}$ $cm^{-2}$ at 15–50 keV. For PFETs, boron may be used at $5\times10^{13}$–$5\times10^{14}$ cm$^{-2}$ at 5–20 keV.

Figure 9A:
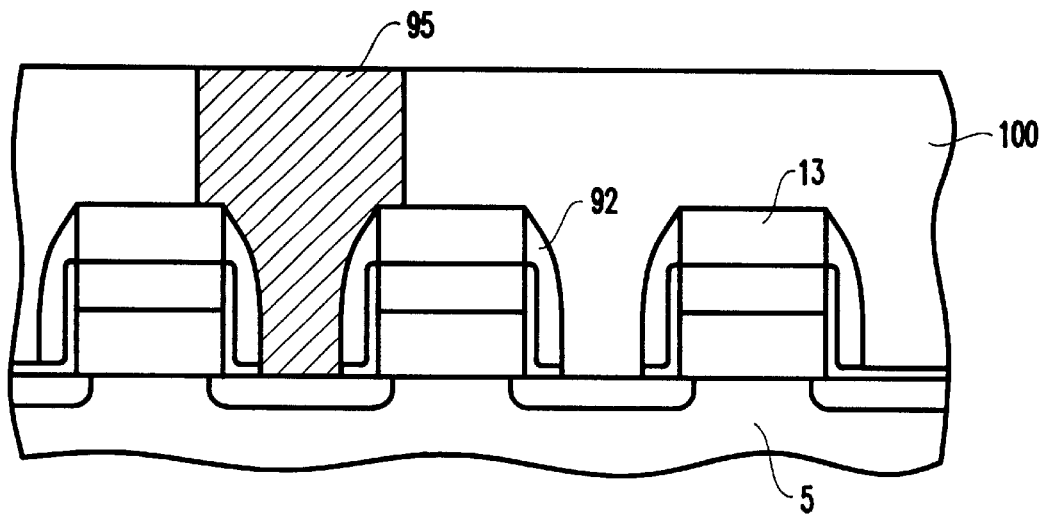
FIGS. 9A and 9B show the semiconductor structure after deposition of interlayer dielectric layer.
Figure 9B:
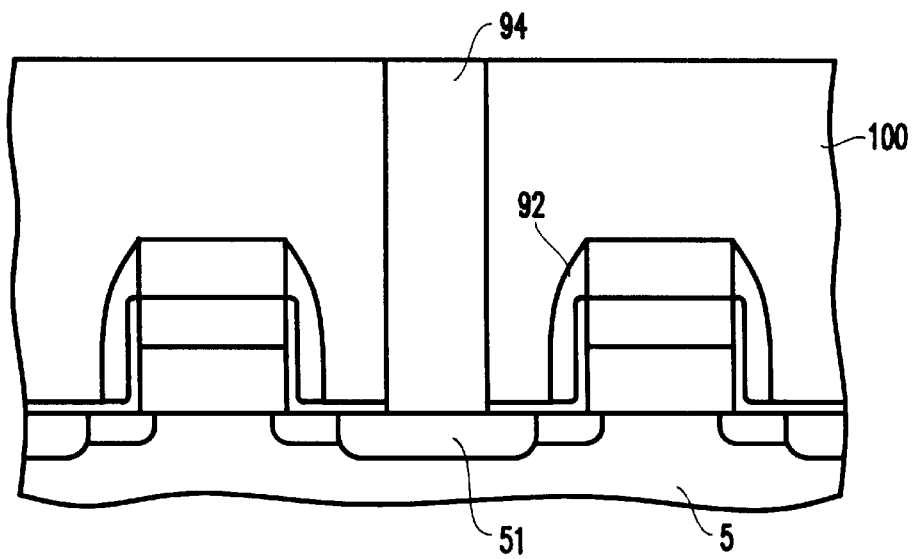

Then, as shown in FIGS. 9A and 9B, nitride spacers 92 are formed on the gate conductor sidewalls (needed for borderless contacts) following standard processing well known in the art. An interlayer dielectric 100 (typically CVD oxide) is deposited and vias are etched for subsequent formation of contact studs. The vias are opened borderless to the gate conductors in the array region (via opening overlaps gate conductor), while the vias are formed between gate conductors in the support region (FIG. 9B). The reason for this distinction is that the metal studs 94 (i.e., tungsten) needed for low-resistance and performance in the support region make the borderless contacts for the support region complicated and expensive. Therefore, to avoid contact stud 94 to gate shorts in the support region, the vias are not opened over the gate conductor. This necessitates wider spacing of the gate conductors in the support region. Since higher series resistance is acceptable in the array region, polysilicon studs 95 are used which allow relatively easy formation of borderless contacts. This dual workfunction/capped gate conductor process is applicable to DRAMs containing either deep trench or stacked capacitor storage elements. The storage capacitors are not shown in FIG. 9A for simplicity.

Figure 10:
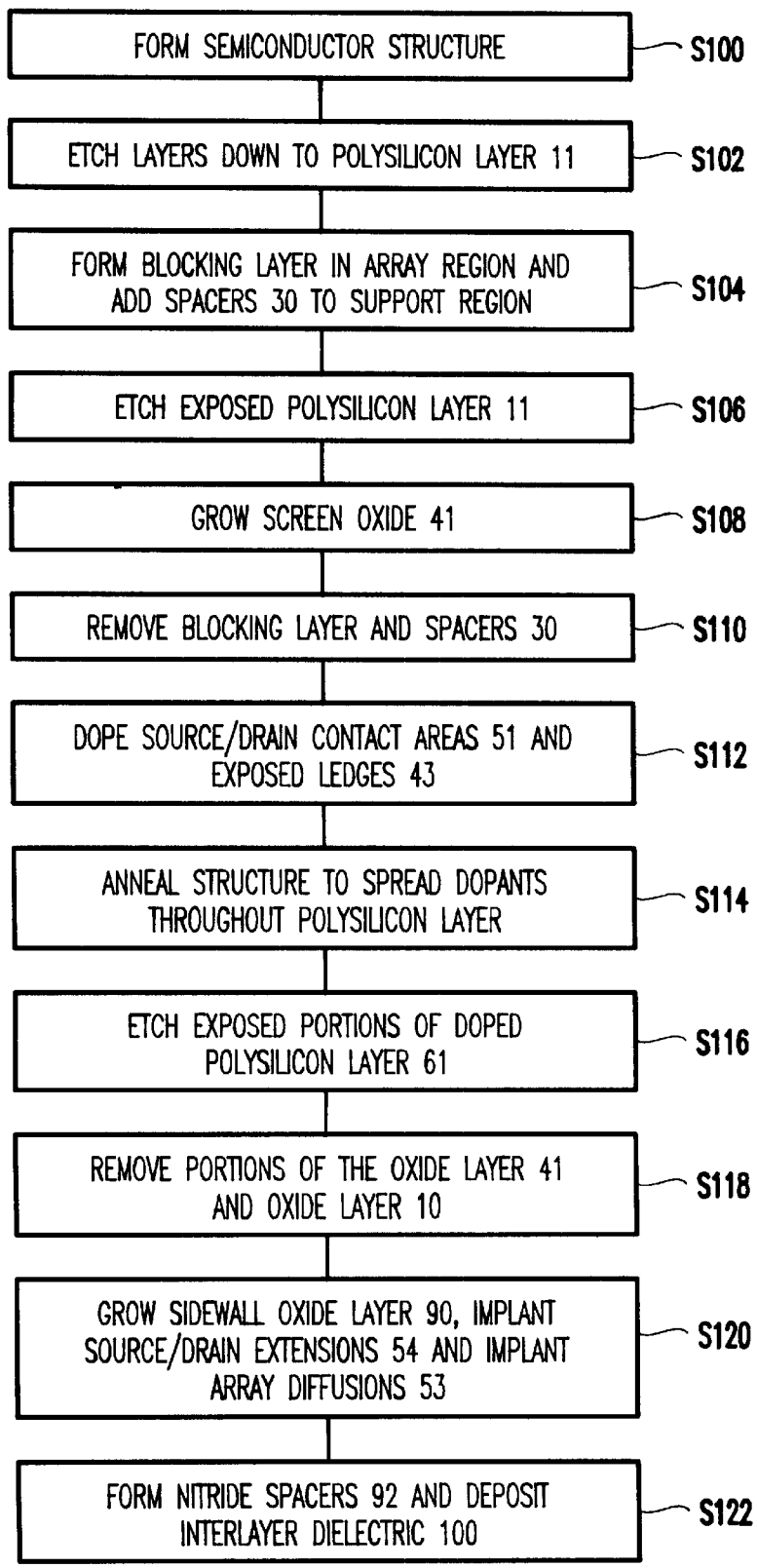
FIG. 10 is a flowchart showing steps of the present invention.

FIG. 10 shows a flowchart showing steps of the present invention. In particular, in step S100, the semiconductor structure is formed and preferably includes the semiconductor substrate 5 containing isolation regions and well doping regions on which is formed the gate oxide layer 10, the intrinsic polysilicon layer 11, the tungsten silicide layer 12 and the nitride cap 13. Then, in step S102, the respective layers are appropriately etched down to the polysilicon layer 11. Subsequently, in step S104, a maskless process forms a blocking layer in the array region and adds spacers 30 in the support region. The exposed polysilicon layer 11 is then etched in step S106 and the screen oxide layer 41 is grown in step S108.

Subsequently, in step S110, the BSG blocking layer in the array region and the spacers 30 in the support region are removed. The source/drain contact areas 51 and the exposed ledges 43 of the polysilicon layer 11 are implanted in step S112. Then, in step S114, the structure is annealed to spread the dopants throughout the polysilicon layer 11 and form a doped polysilicon layer 61. Exposed portions of the doped polysilicon layer 61 are etched in step S116. Subsequently, in step S118, portions of the oxide layer 41 and the oxide layer 10 are removed. Subsequently, the sidewall oxide layer 90 is grown, the source/drain extensions 54 are implanted and the array diffusions 53 are implanted in step S120. Then, in step S122, nitride spacers 92 are formed and an interlayer dielectric 100 is deposited.

The resulting structure thereby forms the desired dual workfunction doping including the self-aligned insulating gate cap. That is, the present invention achieves a dual workfunction requirement by applying either P+ or N+ doping to the gate conductor while at the same time creating a self-aligned cap on the gate conductor. The present invention further allows lightly doped source-drains in the array region for low junction leakage, allows formation of source-drain extensions in support regions for high hot-carrier reliability and does not introduce extra masks.

Still further, the present invention allows the formation of borderless diffusion contacts in the array region for high density. The dual workfunction gates in the support region allow surface channel MOSFETs for high performance.

While the invention has been described with reference to specific embodiments, the description of the specific embodiments is illustrative only and is not to be considered as limiting the scope of the invention. Various other modifications and changes may occur to those skilled in the art without departing from the spirit and scope of the invention.

What is claimed is:

1. A method for providing dual work function doping, the method comprising:

providing a semiconductor substrate, a gate insulator, a conductor comprising intrinsic polysilicon and overlying silicide layer on said semiconductor substrate and an insulating cap on said conductor;

patterning said silicide layer and said insulating cap so as to etch through said silicide layer and said insulating cap while leaving a portion of said intrinsic polysilicon;

providing insulating spacers comprising spacer material along sides of said silicide layer and said insulating cap and so as to rest on top of said insic polysilicon;

doping first portions of said conductor with a first conductive type dopant and second portions of said conductor with a second conductive type dopant; and annealing said conductor such that dopants of said first and second conductive types spread over said respective conductors.

2. The method of claim 1, further comprising etching portions of said silicide layer and portions of said insulating cap to form a partial gate conductor stack prior to providing said insulating spacers.

3. The method of claim 2, wherein an array region formed in said semiconductor substrate is protected due to predetermined tight spacing of gates in the array region, and a space between adjacent gate conductors are filled with glass, and wherein in a support region of said semiconductor substrate the spacing between gate conductors is larger than in the array region, thereby forming an insulating spacer between adjacent gate conductors in the support region.

4. The method of claim 1, wherein said silicide layer comprises WSi$_x$.

5. The method of claim 1, wherein said insulating spacers comprise boron silicate glass spacers.

6. The method of claim 1, further comprising removing said insulating spacers prior to doping said first and second portions of said semiconductor substrate and said conductor.

7. The method of claim 1, wherein said first and second portions of the semiconductor substrate correspond to source and drain contact regions.

8. The method of claim 7, wherein said semiconductor substrate includes support regions and array regions.

9. The method of claim 8, wherein after annealing the conductor, the method further comprises extending the source and drain regions in said support region of said substrate to a region at least under said annealed conductor.

10. The method of claim 8, wherein after annealing said conductor, the method further comprises forming source and drain regions in said array regions.

11. The method of claim 1, wherein after annealing said conductor, the method further comprises etching portions of said conductor.

12. The method of claim 1, further comprising forming a gate sidewall oxide on sidewalls of said annealed conductor.

13. An array of gate structures obtained by the method of claim 1.

14. The method of claim 1, wherein an entire conductor gate stack, formed of said intrinsic polysilicon, said silicide layer and said insulating cap and formed prior to said providing of said insulating spacers, is not completely etched through.

15. The method of claim 1, wherein a dopant for the conductor is introduced on a horizontal surface in which a support region and the array region of the semiconductor substrate are exposed between the conductor in the array region, and such that ledges on the conductors in the support region of the semiconductor substrate are exposed.

16. The method of claim 1, wherein conductors in a support region of the semiconductor substrate are separated such that each gate region is doped independently so that an NFET can be selectively formed adjacent to a PFET.

17. The method of claim 1, wherein in an array region of said semiconductor substrate, no separation between the conductors exists.

18. A method for providing dual work function doping, the method comprising:
   providing a semiconductor substrate, a gate insulator, a conductor comprising intrinsic polysilicon and overlying silicide layer on said semiconductor substrate and an insulating cap on said conductor;
   providing insulating spacers comprising spacer material along sides of said silicide layer and said insulating cap;
   doping first portions of said conductor with a first conductive type dopant and second portions of said conductor with a second conductive type dopant; and
   annealing said conductor such that dopants of said first and second conductive types spread over said respective conductors,
      wherein after providing the insulating spacers and prior to doping, the method further comprises etching said intrinsic conductor at areas of the conductor not covered by said spacer material.

19. The method of claim 18, further comprising forming an oxide layer on portions of the semiconductor substrate not covered with said intrinsic conductor.

20. A method of forming dual work function doping, the method comprising:
   providing a semiconductor substrate, a gate insulator layer, a relatively undoped polysilicon layer on the semiconductor substrate, a highly conductive silicide layer and an insulating cap on said silicide layer;
   patterning said silicide and said insulating cap so as to etch through said silicide layer and said insulating cap while leaving a portion of said intrinsic polysilicon;
   providing insulating spacers comprising spacer material on sidewalls of said insulating cap and said silicide layer and so as to rest on top of said intrinsic polysilicon layer;
   etching portions of said relatively undoped polysilicon layer which are not covered by the spacer material;
   removing the spacer material such that said relatively undoped polysilicon layer includes first and second exposed portions;
   doping first exposed portions of said polysilicon layer with a first conductive type dopant;
   doping second exposed portions of said polysilicon layer with a second conductive type dopant; and
   annealing the polysilicon layer such that remaining portions of said polysilicon layer become doped with said first and second conductive types.

21. The method of claim 20, further comprising etching portions of said silicide layer and portions of said insulating cap to form a partial gate conductor stack prior to providing said insulating spacers.

22. The method of claim 20, wherein said silicide layer comprises $WSi_x$.

23. The method of claim 20, wherein said insulating spacers comprise boron silicate glass spacers.

24. The method of claim 20, further comprising doping portions of the substrate with said first conductive type prior to annealing said polysilicon layer, said portions of the substrate corresponding to source and drain contact regions.

25. The method of claim 24, wherein said semiconductor substrate includes support regions and array regions.

26. The method of claim 25, further comprising extending the source and drain contact regions in said substrate region of said substrate to a region at least under said annealed polysilicon layer.

27. The method of claim 25, wherein after annealing said polysilicon layer, the method further comprises forming source and drain regions in said array regions.

28. The method of claim 20, wherein after annealing said polysilicon layer, the method further comprises etching portions of said polysilicon layer.

29. The method of claim 20, further comprising forming a gate sidewall oxide on sidewalls of said annealed polysilicon layer.

30. An array of gate structures obtained by the method of claim 20.

31. A method of forming dual work function doping, the method comprising:
   providing a semiconductor substrate, a gate insulator layer, a relatively undoped polysilicon layer on the semiconductor substrate, a highly conductive silicide layer and an insulating cap on said silicide layer;
   forming an oxide layer on portions of said semiconductor substrate not covered with said polysilicon layer;
   providing insulating spacers comprising spacer material on sidewalls of said insulating cap and said silicide layer;
   etching portions of said relatively undoped polysilicon layer which are not covered by the spacer material;
   removing the spacer material such that said relatively undoped polysilicon layer includes first and second exposed portions;
   doping first exposed portions of said polysilicon layer with a first conductive type dopant;
   doping second exposed portions of said polysilicon layer with a second conductive type dopant; and
   annealing the polysilicon layer such that remaining portions of said polysilicon layer become doped with said first and second conductive types.

32. A method for providing dual workfunction doping, the method comprising:
   providing a semiconductor substrate, a gate insulator over said semiconductor substrate and conductors comprising a deposited semiconductor material over said gate insulator;
   doping first portions of said semiconductor substrate and first ones of said conductors with a first conductive type dopant and second portions of said semiconductor substrate and second ones of said conductors with a second conductive type dopant; and
   annealing said conductors such that said first and second dopants spread over said respective first and second conductors.

33. A method for providing dual work function doping, the method comprising:
   providing a semiconductor substrate, a gate insulator, a conductor comprising intrinsic polysilicon and overlying silicide layer on said semiconductor substrate and an insulating cap on said conductor;

patterning said silicide layer and said insulating cap;

providing insulating spacers comprising spacer material along sides of said silicide layer and said insulating cap;

doping first portions of said conductor with a first conductive type dopant and second portions of said conductor with a second conductive type dopant; and annealing said conductor such that dopants of said first and second conductive types spread over said respective conductors, wherein said intrinsic polysilicon is left unetched during processing of the method, such that said intrinsic polysilicon protects an upper surface of the semiconductor substrate in an array region of said substrate during a doping of a source and a drain in a support region of said semiconductor substrate.

34. A method for providing dual work function doping, the method comprising:

providing a semiconductor substrate, a gate insulator, a conductor comprising intrinsic polysilicon and overlying silicide layer on said semiconductor substrate and an insulating cap on said conductor;

patterning said silicide layer and said insulating cap;

providing insulating spacers comprising spacer material along sides of said silicide layer and said insulating cap;

doping first portions of said conductor with a first conductive type dopant and second portions of said conductor with a second conductive type dopant; and annealing said conductor such that dopants of said first and second conductive types spread over said respective conductors, wherein a gate stack including said intrinsic polysilicon, said silicide layer and said insulating cap is only partially etched such that etching is performed only through the silicide layer and said insulating cap.

35. A method for providing dual work function doping, the method comprising:

providing a semiconductor substrate, a gate insulator, a conductor comprising intrinsic polysilicon and overlying silicide layer on said semiconductor substrate and an insulating cap on said conductor;

patterning said silicide layer and said insulating cap;

providing insulating spacers comprising spacer material along sides of said silicide layer and said insulating cap;

doping first portions of said conductor with a first conductive type dopant and second portions of said conductor with a second conductive type dopant; and annealing said conductor such that dopants of said first and second conductive types spread over said respective conductors, wherein said insulating spacers are formed only on the sidewall of a gate stack formed by said silicide layer and said insulating cap, and wherein doping occurs only through a horizontal surface of said intrinsic polysilicon and without going through sidewalls of said intrinsic polysilicon.

* * * * *